United States Patent [19]
Tamamura et al.

[11] Patent Number: 5,001,361
[45] Date of Patent: Mar. 19, 1991

[54] MASTER-SLAVE FLIP-FLOP CIRCUIT

[75] Inventors: Masaya Tamamura, Inagi; Shinji Emori, Urawa; Yoshio Watanabe; Isao Shimotsuhama, both of Kawasaki, all of Japan

[73] Assignee: Fujitsu Limited, Kawasaki, Japan

[21] Appl. No.: 349,251

[22] Filed: May 9, 1989

[30] Foreign Application Priority Data

May 13, 1988 [JP] Japan ................. 63-114854
May 13, 1988 [JP] Japan ................. 63-117626

[51] Int. Cl.⁵ .......................................... H03K 3/289
[52] U.S. Cl. ................................ 307/272.2; 307/289
[58] Field of Search .............. 307/272.1, 272.2, 455, 307/289, 530

[56] References Cited

U.S. PATENT DOCUMENTS

| | | | |
|---|---|---|---|
| 4,551,639 | 11/1985 | Takeda et al. | 307/272.1 |
| 4,560,888 | 12/1985 | Oida | 307/272.2 |
| 4,601,049 | 7/1986 | Wilhelm et al. | 307/277.2 |
| 4,779,009 | 10/1988 | Tsunoi et al. | 307/272.2 |
| 4,810,908 | 3/1989 | Suzuki et al. | 307/455 |

FOREIGN PATENT DOCUMENTS

| | | | |
|---|---|---|---|
| 0209464 | 1/1978 | European Pat. Off. | 351/272.2 |
| 1132343 | 12/1984 | U.S.S.R. | 307/272.2 |

Primary Examiner—Timothy P. Callahan
Attorney, Agent, or Firm—Staas & Halsey

[57] ABSTRACT

A master-slave flip-flop circuit is made up of a master part which holds a data signal responsive to a clock signal and outputs the held data signal in the form of complementary output signals, and a slave part which holds the complementary output signals responsive to the clock signal and outputs at least one of the held complementary output signals. The complementary output signals of the master part have a logic amplitude which is smaller than a logic amplitude of the output signal of the slave part to ensure correct operation even when the data signal and the clock signal have high frequencies.

18 Claims, 6 Drawing Sheets

FIG.4 PRIOR ART
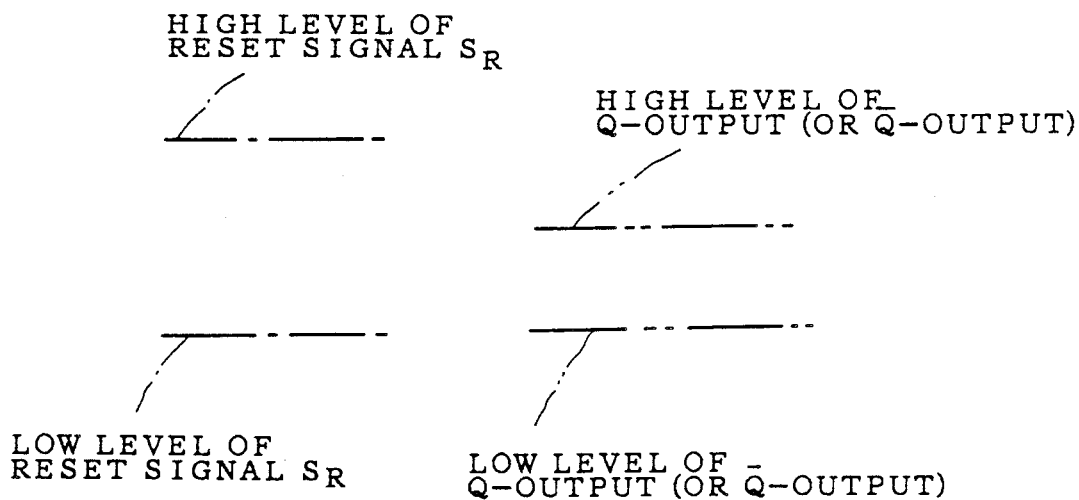
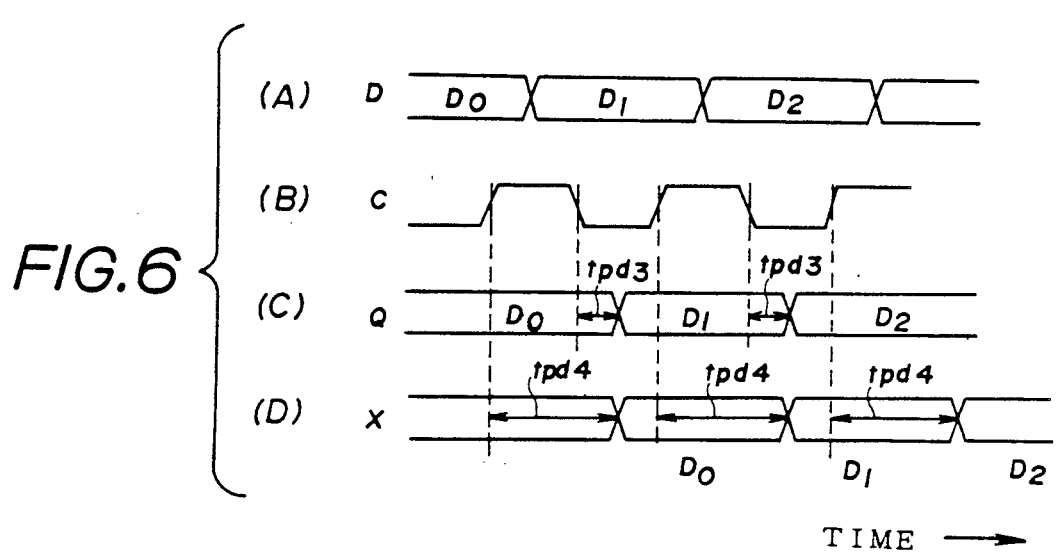
FIG.6

MASTER-SLAVE FLIP-FLOP CIRCUIT

BACKGROUND OF THE INVENTION

The present invention generally relates to master-slave flip-flop circuits, and more particularly to a master-slave flip-flop circuit made up of a master part and a slave part.

Conventionally, there exists a master-slave flip-flop circuit which is made up of a master part provided in a first stage and a slave part provided in a latter stage and uses a single phase clock signal by inverting it. Because no clock skew occurs in this flip-flop circuit, no racing phenomenon will occur even when such flip-flop circuits are connected in a plurality of stages. Hence, such flip-flop circuits are often used in a semiconductor integrated circuit.

Recently, with an increase of operation speeds of systems, there are demands for a master-slave flip-flop circuit capable of carrying out a high-speed operation.

FIG. 1 generally shows a conventional master-slave flip-flop circuit. A data signal Din shown in FIG. 2(A) is applied to a terminal 10 and is supplied to a data input terminal D of a master part 11. A clock signal CK shown in FIG. 2(B) is applied to a terminal 12 and is supplied to a clock input terminal C of the master part 11 and to a clock input terminal $\overline{C}$ of a slave part 13.

The master part 11 enters the data signal Din when the level of the clock signal CK falls to a low level and outputs from an output terminal Q a data signal shown in FIG. 2(C) after a time tpd1 from the fall in the clock signal CK. A data signal which is inverted is output from an output terminal $\overline{Q}$ of the master part 11. The time tpd1 is a propagation delay time of the master part 11.

The slave part 13 enters the output signals from the output terminals Q and $\overline{Q}$ of the master part 11 when the level of the clock signal CK rises to a high level and outputs from an output terminal X a data signal shown in FIG. 2(D) after a time tpd2 from the rise in the clock signal. A data signal which is inverted is output from an output terminal $\overline{X}$ of the slave part 13. The time tpd2 is a propagation delay time of the slave part 13. The output signals of the slave part 13 from the terminals X and $\overline{X}$ are respectively obtained through output terminals 14 and 15.

In a gate array system semiconductor device, the master part 11 and the slave part 13 are constituted by identical basic cells. Generally, a logic amplitude which is a potential difference between a voltage which describes a value "0" and a voltage which describes a value "1" is set to the same value for the master part 11 and the slave part 13. In addition, the logic amplitude must be set to a sufficiently large value so as to take into account a noise margin of a circuit which is provided in a stage subsequent to the master-slave flip-flop circuit.

However, the times tpd1 and tpd2 become large when the logic amplitude is large and the operation speed of the master-slave flip-flop circuit becomes slow. For this reason, when the data signal Din and the clock signal CK respectively shown in FIGS. 2(E) and 2(F) have high frequencies and a low-level period of the clock signal CK is shorter than the time tpd1, the clock signal CK rises to the high level before the data signal D1 which is sampled by the master part 11 is transmitted to the slave part 13. In this case, the slave part 13 samples the data signal D0 again as may be seen from FIGS. 2(G) and 2(H), thereby resulting in an erroneous operation of the master-slave flip-flop circuit.

On the other hand, the master-slave flip-flop circuit is used in various digital circuits and is used in a form of an integrated circuit to build a system, and there is a need to set and reset signals within the master-slave flip-flop circuit. The signals within the master-slave flip-flop circuit are set and reset when initializing the master-slave flip-flop circuit after building the system or set and reset with an arbitrary timing. Hence, the master-slave flip-flop circuit used in such a system is provided with set and reset functions.

FIG. 3 shows an example of a conventional master-slave flip-flop circuit employing series gate type emitter coupled logic (ECL) circuits and having set and reset functions. The series gate type circuit refers to a circuit in which differential transistor pairs are connected in series in a plurality of stages between voltage sources $V_{EE}$ and GND.

In FIG. 3, the master-slave flip-flop circuit is made up of a master circuit MST and a slave circuit SLV. The master circuit MST is arranged at an input stage of the master-slave flip-flop circuit and temporarily latches an input logic signal. The master circuit MST also transmits the input logic signal to the slave circuit SLV which is arranged at an output stage so as to output signals through output terminals X and $\overline{X}$ of the slave circuit SLV. In FIG. 3, Vref1 and Vref2 denote reference voltage signals.

Voltage levels at various parts of the master circuit MST are set so that the master circuit MST operates responsive small amplitude logic signals and carries out a high-speed operation. For example, the small amplitude logic signals indicate a high level when the voltage is $-0.9$ V and indicate a low level when the voltage is $-1.8$ V.

Next, a description will be given of a latch operation of the master-slave flip-flop circuit. When the clock signal CK applied to the terminal 12 has a low level and the data signal Din is applied to a base of a transistor T4 through the terminal 10, the transistor T4 turns ON when the logic level of the data signal Din is high and the signal level of the data signal Din is higher than that of the reference voltage signal Vref1. As a result, a current path is formed from the voltage source GND, a level shift resistor r1, a voltage dividing resistor r2, the transistor T4, a transistor T10, a transistor T12, and the voltage source $V_{EE}$. The voltage dividing resistor r2 determines the signal amplitude of the circuit.

In this state, a signal level at a node N1 which connects the voltage dividing resistor r2 and a collector of the transistor T4 is low. On the other hand, a signal level at a node N2 which connects a voltage dividing resistor r3 and a collector of a transistor T5 is high. Accordingly, an output transistor T15 transmits a high level, a signal level at a base of a latch transistor T9 becomes high, and the latch transistor T9 turns ON. When the clock signal CK undergoes a transition to a high level in this state, a transistor T11 turns ON. As a result, a current path is formed from the voltage source GND, the level shift resistor r1, the voltage dividing resistor r2, the latch transistor T9, the transistor T11, the transistor T12, and the voltage source $V_{EE}$. By the formation of this current path, the high level of the data signal Din is latched and this high level is held thereafter regardless of the existence of the data signal Din.

Next, a description will be given of the reset operation of the master-slave flip-flop circuit. When resetting the high level signal which is held as described above, a high-level reset signal $S_R$ is applied to a terminal 17. Transistors T7 and T11 are forcibly turned ON responsive to the high-level reset signal $S_R$. As a result, a current path is formed from the voltage source GND, the level shift resistor r1, the voltage dividing resistor r3, the transistor T7, the transistor T11, the transistor T12, and the voltage source $V_{EE}$. Thus, the latched high-level signal, that is, the logic level at the node N2 between the voltage dividing resistor r3 and the transistor T5, is inverted from the high level to the low level. Consequently, the output transistor T15 transmits a low level, and the transistor T9 turns OFF. On the other hand, an output transistor T14 transmits a high level, and a transistor T6 turns ON to maintain the reset state. The reset operation is completed in this manner.

Therefore, in order to reset the master-slave flip-flop circuit, a voltage $V_H$ of the reset signal $S_R$, that is, a base voltage of the transistor T7, must be set higher than a base voltage of the latch transistor T9. The reset voltage $V_H$ must thus satisfy the following relationship (1), where r1 denotes a resistance of the level shift resistor r1, $I_{CS}$ denotes a current source current, $V_{BE(T15)}$ denotes a base-emitter voltage of the output transistor T15, $I_1$ denotes a current flowing through the output transistor T15, and r5 denotes a resistance of an adjusting resistor r5.

$$V_H > -(r1.I_{CS} + V_{BE(T15)} + I_1.r5) \quad (1)$$

As may be seen from the relationship (1), an emitter voltage of the output transistor T15 needs to be set lower than the reset voltage $V_H$ in order to set the base voltage of the transistor T9 to a low value, and this may be achieved by adding a voltage drop Vr5 of an adjusting resistor r5 to a voltage drop Vr1 ($= r1.I_{CS}$) of the level shift resistor r1 and the base-emitter voltage $V_{BE(T15)}$ of the output transistor T15. Hence, the voltage adjustment can be made depending on a resistance of the adjusting resistor r4.

FIG. 4 shows a relationship of the high and low levels of the reset signal $S_R$ and the high and low levels at Q-output and $\overline{Q}$-output terminals.

A set operation can be carried out similarly to the reset operation in response to a set signal $S_S$ which is applied to a terminal 18, and a description thereof will be omitted.

As described before, the master-slave flip-flop circuit shown in FIG. 3 is designed to carry out a high-speed operation responsive to small amplitude logic signals. However, the problem of this master-slave flip-flop circuit is that the high-speed operation is restricted by the provision of the adjusting resistor r4 at the output stage of the circuit. In other words, a delay is introduced to the rise and fall of the signal by the adjusting resistor r5 (or r4) which is connected in series to an emitter of the output transistor T15 (or T14). But when this adjusting resistor r5 (or r4) is omitted, there is a problem in that the set and reset operations of the master-slave flip-flop circuit can no longer be carried out satisfactorily.

SUMMARY OF THE INVENTION

Accordingly, it is a general object of the present invention to provide a novel and useful master-slave flip-flop circuit in which the problems described above are eliminated.

Another and more specific object of the present invention is to provide a master-slave flip-flop circuit comprising a data input terminal for receiving a data signal, a clock input terminal for receiving a clock signal, a master part supplied with the data signal and the clock signal through the respective data input and clock input terminals for producing complementary output signals, a slave part responsive to the clock signal and the complementary output signals of the master part, and at least one output terminal for outputting an output signal of the slave part. The complementary output signals of the master part have a logic amplitude which is smaller than a logic amplitude of the output signal of the slave part. According to the master-slave flip-flop circuit of the present invention, it is possible to realize a high-speed operation of the flip-flop circuit without deteriorating a noise margin of the circuit as a whole. In addition, no erroneous operation will occur even when the flip-flop circuit operates responsive to high-frequency signals.

Still another object of the present invention is to provide a master-slave flip-flop circuit comprising a first terminal for receiving a data signal, a second terminal for receiving a clock signal, a third terminal for receiving a set signal, a fourth terminal for receiving a reset signal, first and second power sources, a master part supplied with the signals from the first through fourth terminals and including a level shift resistor, series gate type differential circuits coupled between the first and second power sources through the level shift resistor, and a pair of output transistors coupled between the first and second power sources and responsive to signals received through the level shift resistor for outputting complementary output signals, a slave part responsive to the clock signal and the complementary output signals of the master part, a set and reset circuit for setting a signal latching state within the master part responsive to the set signal from the third terminal and for resetting the signal latching state within the master part responsive to the reset signal from the fourth terminal, and at least one output terminal for outputting an output signal of the slave part. The level shift resistor has a resistance which satisfies a relationship $V_H > -(V_{RL} + V_{BE})$, where $V_H$ denotes a voltage of the set and reset signals during a high-level period thereof, $V_{RL}$ denotes a voltage drop caused by the level shift resistor, and $V_{BE}$ denotes a base-emitter voltage of the output transistors. According to the master-slave flip-flop circuit of the present invention, it is possible to realize a high-speed operation of the flip-flop circuit and support the set and reset functions without providing adjusting resistors at output stages of the output transistors.

Other objects and further features of the present invention will be apparent from the following detailed description when read in conjunction with the accompanying drawings.

BRIEF DESCRIPTION OF THE DRAWINGS

FIG. 4 is a diagram for explaining logic levels of signals input and output to and within the master-slave flip-flop circuit shown in FIG. 3;

FIGS. 6(A) through 6(D) are timing charts for explaining the first embodiment;

DETAILED DESCRIPTION OF THE PREFERRED EMBODIMENTS

Figure 5:
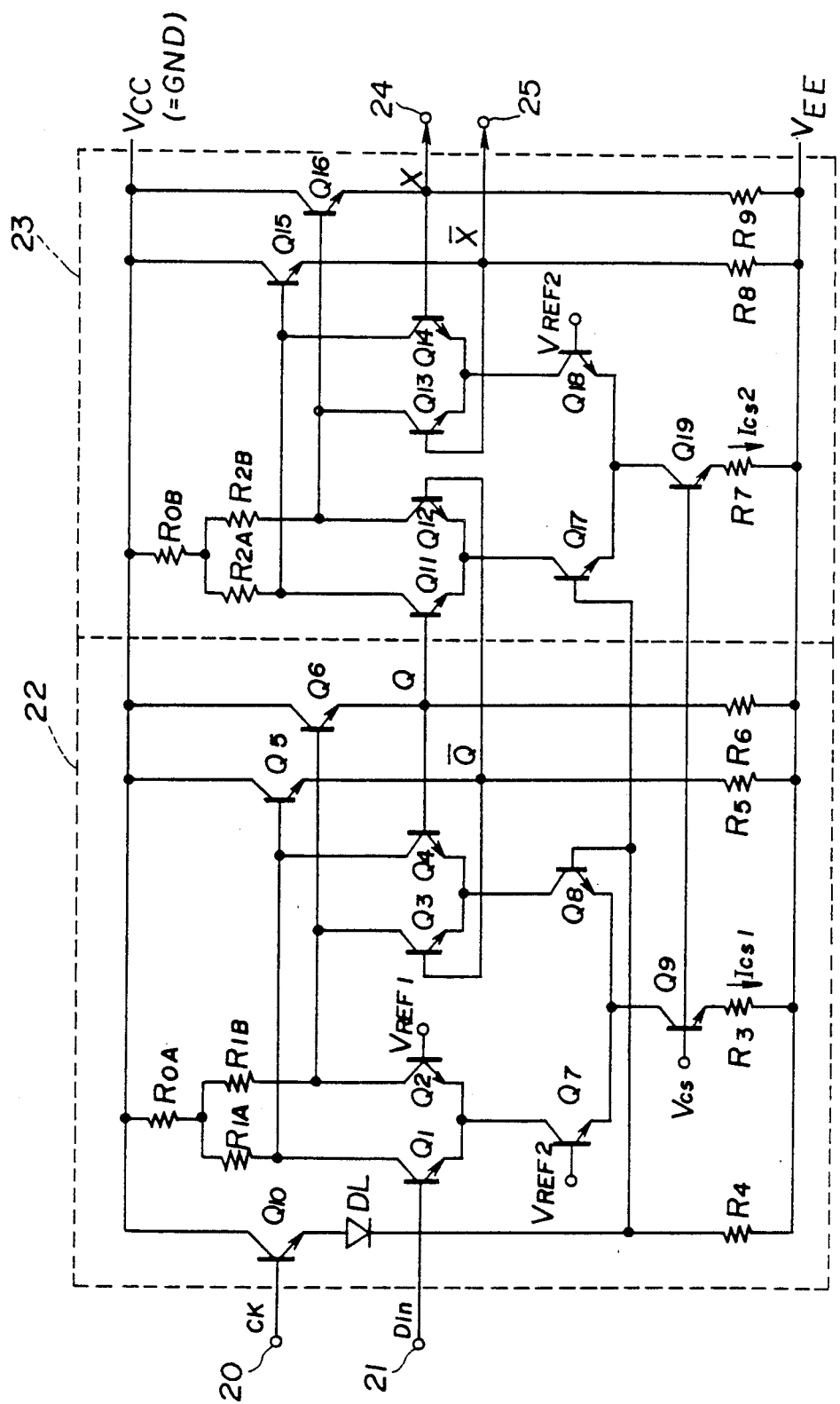
FIG. 5 is a circuit diagram showing a first embodiment of a master-slave flip-flop circuit according to the present invention.

FIG. 5 shows a first embodiment of a master-slave flip-flop circuit according to the present invention. In FIG. 5, a master-slave flip-flop circuit is made up of a master part 22 and a slave part 23. A clock signal CK is applied to a terminal 20, and a data signal Din is applied to a terminal 21.

In the master part 22, the data signal is supplied to a base of a transistor Q1 through the terminal 21, and emitters of the transistor Q1 and a transistor Q2 are connected. A reference voltage $V_{REF1}$ is supplied to a base of the transistor Q2. A first terminal of a resistor $R_{0A}$ is connected to a power source Vcc (=GND), and a second terminal of the resistor $R_{0A}$ is coupled to a collector of the transistor Q1 through an output resistor $R_{1A}$ and to a collector of the transistor Q2 through an output resistor $R_{1B}$. The output resistors $R_{1A}$ and $R_{1B}$ have identical resistances. The collector of the transistor Q1 is also connected to a collector of a transistor Q4 and a base of a transistor Q5. The collector of the transistor Q2 is also connected to a collector of a transistor Q3 and a base of a transistor Q6.

Emitters of the transistors Q3 and Q4 are connected. A base of the transistor Q3 is connected to an emitter of the transistor Q5, and a base of the transistor Q4 is connected to an emitter of the transistor Q6. The emitters of the transistors Q1 and Q2 are connected to a collector of a transistor Q7, and the emitters of the transistors Q3 and Q4 are connected to a collector of the transistor Q8. Emitters of the transistors Q7 and Q8 are connected in common to a collector of a transistor Q9. A bias signal voltage $V_{CS}$ is supplied to a base of the transistor Q9, and an emitter of the transistor Q9 is coupled to a power source $V_{EE}$ through a resistor R3. The circuit made up of the transistor Q9 and the resistor R3 is a current source circuit.

In other words, ECL circuits, that is, differential circuits respectively include transistor pairs of the transistors Q1 and Q2, the transistors Q3 and Q4, and the transistors Q7 and Q8 are connected in series in a plurality of stages in the form of the so-called series gate type structure.

In addition, a transistor Q10 which is supplied with the clock signal CK to a base thereof constitutes an emitter follower together with a resistor R4. A level shift diode DL is coupled between an emitter of the transistor Q10 and the resistor R4.

The clock signal CK which passes through the diode DL is supplied to a base of the transistor Q8, while a reference volta $V_{REF2}$ is supplied to a base of the transistor Q7.

On the other hand, the transistors Q5 and Q6 respectively constitute emitter followers together with corresponding resistors R5 and R6. A node which connects an emitter of the transistor Q6 and the resistor R6 corresponds to a Q-output terminal, and a node which connects an emitter of the transistor Q5 and the resistor R5 corresponds to a $\overline{Q}$-output terminal.

In the slave part 23, a base of a transistor Q11 is supplied with an output signal of the transistor Q6 through the Q-output terminal, and a base of a transistor Q12 is supplied with an output signal of the transistor Q5 through the $\overline{Q}$-output terminal. Emitters of the transistors Q11 and Q12 are connected. A first terminal of a resistor $R_{0B}$ is connected to the power source Vcc, and a second terminal of the resistor $R_{0B}$ is coupled to a collector of the transistor Q11 through an output resistor $R_{2A}$ and to a collector of the transistor Q12 through an output resistor $R_{2B}$. The output resistors $R_{2A}$ and $R_{2B}$ have identical resistances. The collector of the transistor Q11 is also connected to a collector of a transistor Q14 and a base of a transistor Q15. The collector of the transistor Q12 is also connected to a collector of a transistor Q13 and a base of a transistor 216.

Emitters of the transistors Q13 and Q14 are connected. A base of the transistor Q13 is connected to an emitter of the transistor Q15, and a base of the transistor Q14 is connected to an emitter of the transistor Q16. The emitters of the transistors Q11 and Q12 are connected to a collector of a transistor Q17, and the emitters of the transistors Q13 and Q14 are connected to a collector of the transistor Q18. Emitters of the transistors Q17 and Q18 are connected in common to a collector of a transistor Q19. The bias signal voltage $V_{CS}$ is supplied to a base of the transistor Q19, and an emitter of the transistor Q19 is coupled to the power source $V_{EE}$ through a resistor R7.

In other words, ECL circuits, that is, differential circuits respectively include transistor pairs of the transistors Q11 and Q12, the transistors Q13 and Q14, and the transistors Q17 and Q18 are connected in series in a plurality of stages in the form of the so-called series gate type structure.

The clock signal CK which passes through the diode DL is supplied to a base of the transistor Q17, while the reference volta $V_{REF2}$ is supplied to a base of the transistor Q18.

On the other hand, the transistors Q15 and Q16 respectively constitute emitter followers together with corresponding resistors R8 and R9. A node which connects an emitter of the transistor Q16 and the resistor R9 corresponds to an X-output terminal, and a node which connects an emitter of the transistor Q15 and the resistor R8 corresponds to an $\overline{X}$-output terminal. The X-output terminal is connected to a terminal 24, while the $\overline{X}$-output terminal is connected to a terminal 25.

For example, in the master part 22, the resistor $R_{0A}$ has a resistance of 200 ohms, the resistors $R_{1A}$ and $R_{1B}$ have resistances of 300 ohms, and a current $I_{CS1}$ flowing through the resistor R3 is 1 mA. Similarly, in the slave part 23, the resistor $R_{0B}$ has a resistance of 200 ohms, the resistors $R_{2A}$ and $R_{2B}$ have resistances of 600 ohms, and a current $I_{CS2}$ flowing through the resistor R7 is 1 mA.

For this reason, a logic amplitude of the master part 22 described by $I_{CS1} \times R_{1A}$ is 0.3 V, and the high and low levels at the Q-output and $\overline{Q}$-output terminals respectively are $-1.0$ V and $-1.3$ V. On the other hand, a logic amplitude of the slave part 23 described by $I_{CS2} \times R_{2A}$ is 0.6 V, and the high and low levels at the X-output and $\overline{X}$-output terminals respectively are $-1.0$ V and $-1.6$ V.

The logic amplitude of 0.6 V in the slave part 23 takes into account a noise margin and is substantially the same as the logic amplitude employed in the slave part of the conventional master-slave flip-flop circuit. However, the logic amplitude of 0.3 V in the master part 22 is ½ the logic amplitude employed in the slave part 23. Thus, a propagation delay time tpd4 of the slave part 23 is approximately 80 psec, for example which is substantially the same as that of the conventional master-slave flip-flop circuit, while a propagation delay time tpd3 of the master part 22 is approximately 50 psec, for example which is smaller than the propagation delay time tpd4.

FIGS. 6(A), 6(B), 6(C), and 6(D) respectively show the data signal Din applied to the terminal 21, the clock signal CK applied to the terminal 22, the signal output from the Q-output terminal, and the signal output from the X-output terminal. When the level of the clock signal CK shown in FIG. 6(B) falls to the low level, the transistor Q7 of the master part 22 turns ON and operates the ECL circuit which is made up of the transistors Q1 and Q2. Hence, the data signal Din shown in FIG. 6(A) is sampled. As shown in FIG. 6(C), the sampled data signal propagates to the Q-output terminal after the time tpd3 from the fall in the clock signal CK. When the level of the clock signal CK rises to the high level, the transistor Q8 turns ON and operates the ECL circuit which is made up of the transistors Q3 and Q4. Thus, the output values at the Q-output and $\overline{Q}$-output terminals are held by the transistors Q3 and Q4.

On the other hand, when the level of the clock signal CK rises to the high level, the transistor Q17 of the slave part 23 turns ON and operates the ECL circuit which is made up of the transistors Q11 and Q12. Hence, the output values from the Q-output and $\overline{Q}$-output terminals are sampled. As shown in FIG. 6(D), the sampled value propagates to the X-output terminal after the time tpd4 from the rise in the clock signal CK. When the level of the clock signal CK falls to the low level, the transistor Q18 turns ON and operates the ECL circuit which is made up of the transistors Q13 and Q14. Thus, the output values at the X-output and $\overline{X}$-output terminals are held by the transistors Q13 and Q14.

Because the time tpd3 is considerably reduced compared to the time tpd4, the erroneous operation described before in conjunction with FIGS. 2(E) through 2(H) will not occur as long as the time tpd3 is smaller than a low-level period of the clock signal CK. Therefore, the master-slave flip-flop circuit can carry out a high-speed operation.

In most cases, only one of the terminals 24 and 25 is connected to a circuit which is provided in a stage subsequent to the master-slave flip-flop circuit. For this reason, the logic amplitude at the X-output and $\overline{X}$-output terminals cannot be set smaller than 0.6 V when the noise margin is considered.

Figure 7:
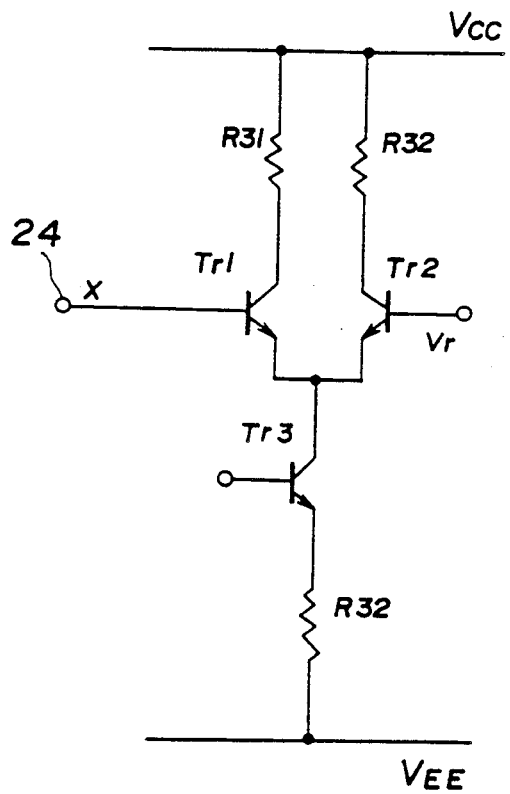
FIG. 7 is a circuit diagram showing an example of a circuit which is connected to an output side of the first embodiment.

FIG. 7 shows an example of the circuit which is provided in the stage subsequent to the master-slave flip-flop circuit. The circuit includes transistors Tr1 through Tr3 and resistors R31 through R33 which are connected as shown. For example, the output value at the X-output terminal is supplied to a base of the transistor Tr1 through the terminal 24. A reference voltage Vr is applied to a base of the transistor Tr2. When the noise margin is considered, it is necessary that the high level in the circuit shown in FIG. 7 is approximately 0.3 V higher than the reference voltage Vr and the low level is approximately 0.3 V lower than the reference voltage Vr, as indicated by one-dot chain lines in FIG. 8. This means that the logic amplitude at the X-output terminal cannot be set smaller than 0.6 V as described above.

Figure 8:
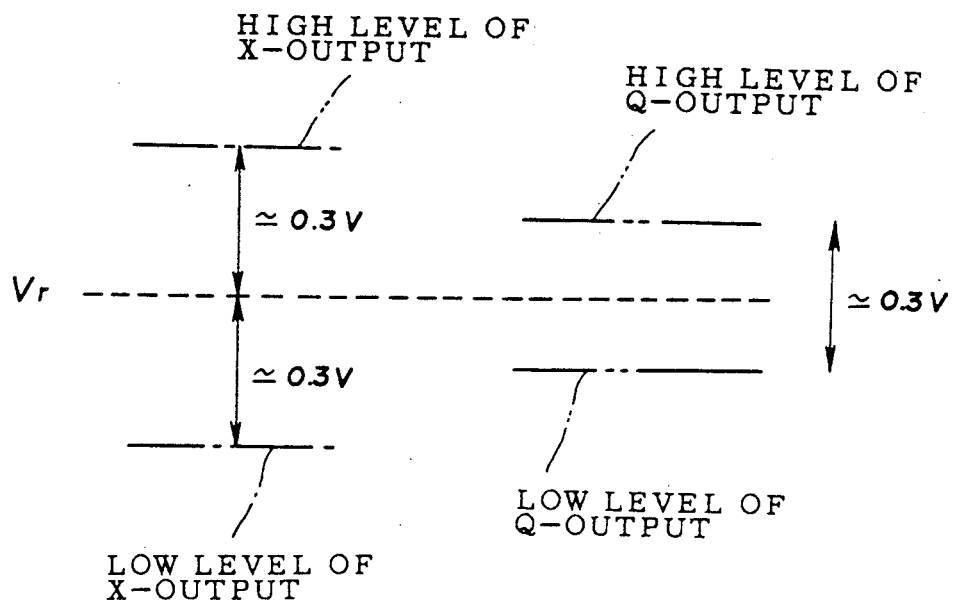
FIG. 8 is a diagram for explaining logic signal levels input and output to and within the first embodiment.

However, the output values at the Q-output and $\overline{Q}$-output terminals are supplied to the ECL circuit which is made up of the transistors Q11 and Q12 and carries out a differential operation, and a sufficient noise margin is ensured even when the logic amplitude is approximately 0.3 V as indicated by two-dot chain lines in FIG. 8, for example. No problems will occur by this setting of the output values at the Q-output and $\overline{Q}$-output terminals.

In addition, in this embodiment, the currents $I_{CS1}$ and $I_{CS2}$ are set to identical values and the resistances of the resistors $R_{1A}$ and $R_{1B}$ are set to values which are smaller than the resistances of the resistors $R_{2A}$ and $R_{2B}$. These measures are taken because the time tpd3 can be set smaller as the current $I_{CS1}$ becomes larger, and the time tpd3 can be set smaller as the resistances of the resistors $R_{1A}$ and $R_{1B}$ become smaller due to reduced stray capacitances.

The diode DL and the resistors $R_{0A}$ and $R_{0B}$ are provided for level adjustment and may be omitted.

This embodiment uses series gate type ECL circuits which are made up of npn type transistors, but the npn type transistors may be replaced by gallium arsenide system n-channel field effect transistors (FETs). In this case, the series gate type ECL circuits are accordingly replaced by series gate type source-coupled FET logic (SCFL) circuits which are also differential circuits.

When realizing this embodiment by a gate array, a plurality of cells of the gate array constitute cell pairs respectively made up of a master part cell and a slave part cell. In this case, the master part cell and the slave part cell respectively include first collector resistors (output resistors) which have identical resistances, and the master part cell additionally includes a second collector resistor (output resistor) which has a small resistance. When the master part cell is used as the master part of the master-slave flip-flop circuit, the second collector resistor is connected and used. On the other hand, when the master part cell is used as a general logic gate such as a NOR circuit, the first collector resistor is connected and used. As a result, a sufficiently large output logic amplitude is obtainable as in the case of the ordinary gate array.

Figure 1:
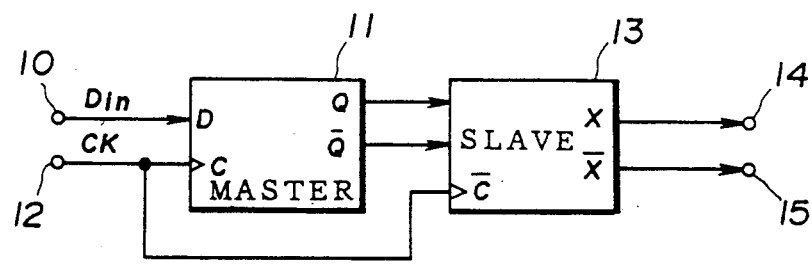
FIG. 1 is a system block diagram showing a conventional master-slave flip-flop circuit.
Figure 2:
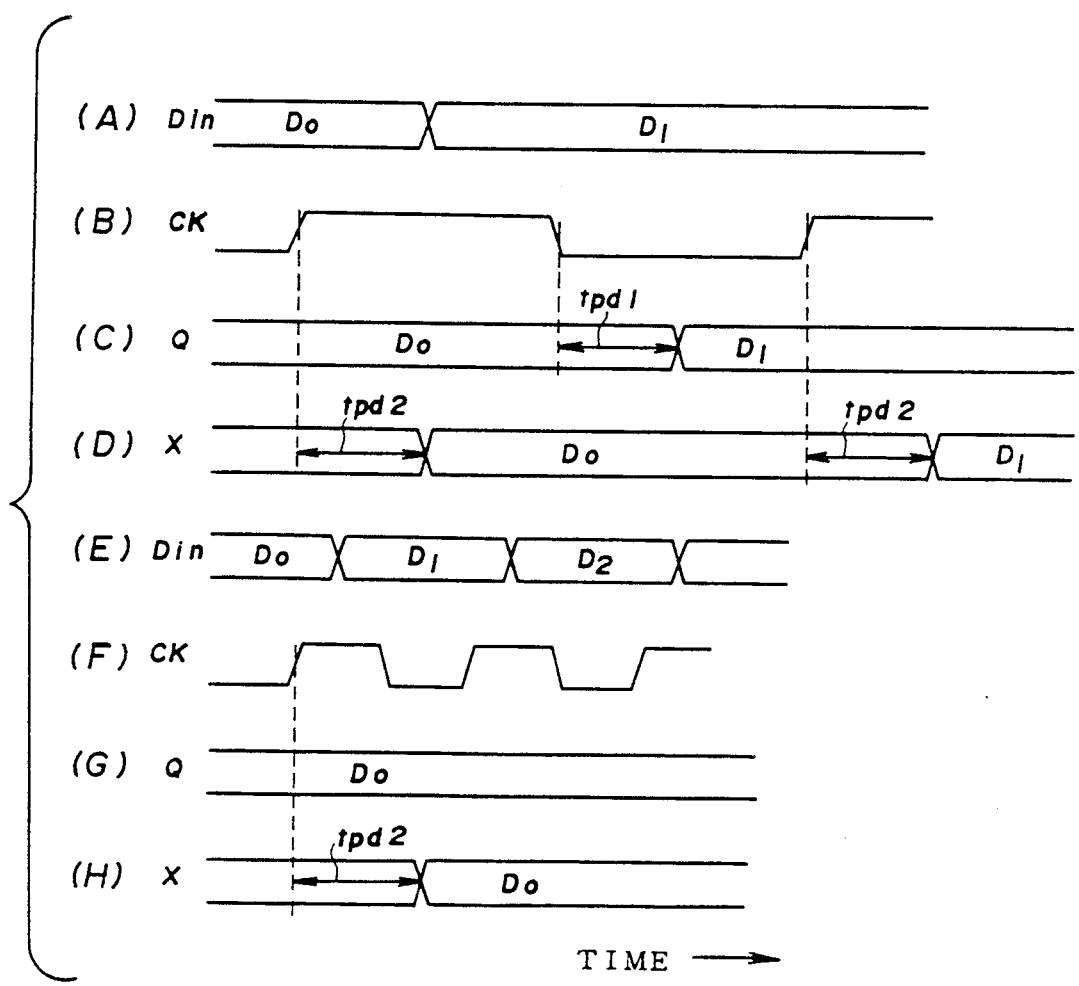
FIGS. 2(A) through 2(H) are timing charts for explaining an operation of the master-slave flip-flop circuit shown in FIG. 1.
Figure 3:
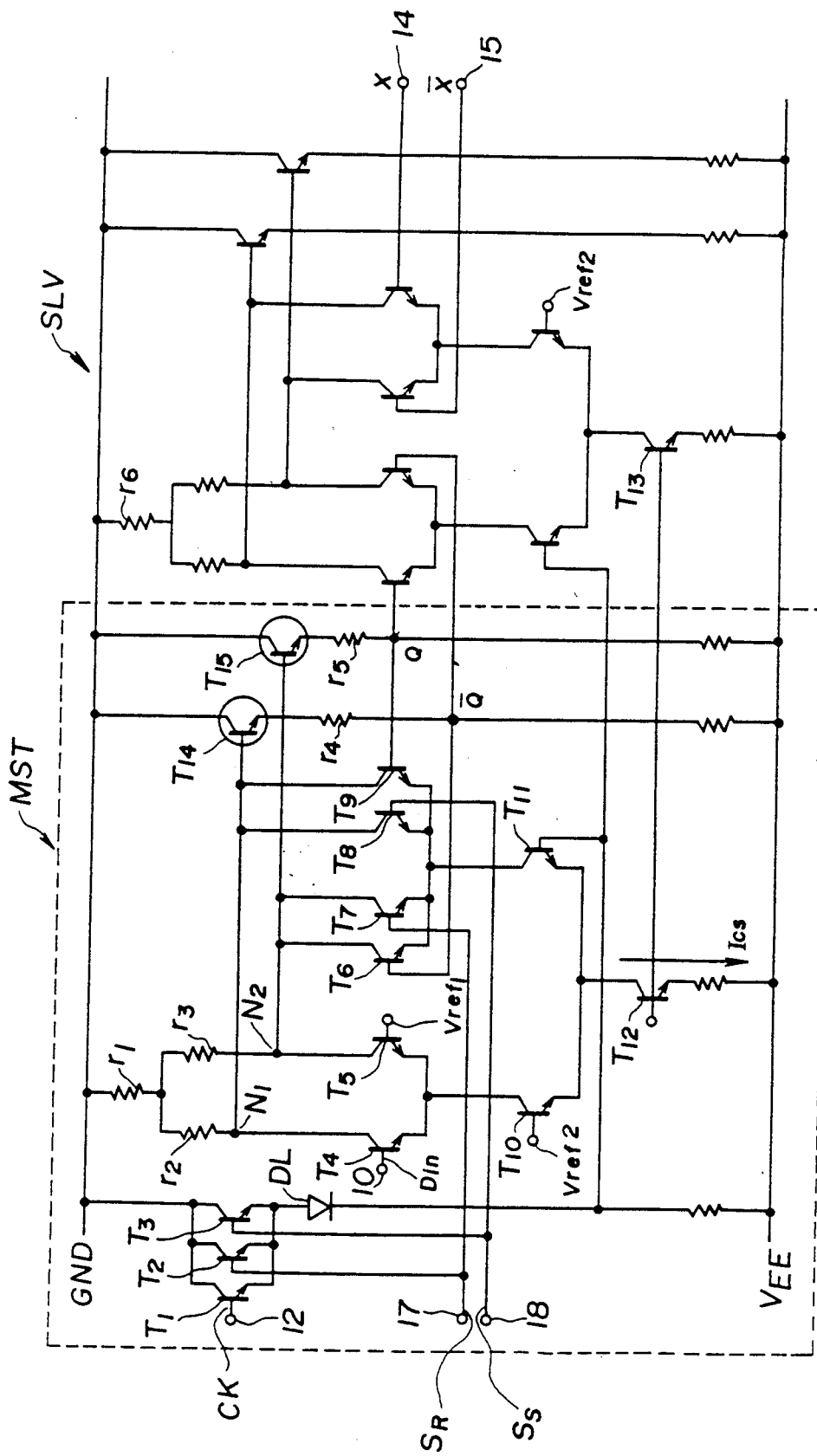
FIG. 3 is a circuit diagram showing an example of a conventional master-slave flip-flop circuit employing ECL circuits and having set and reset functions.
Figure 9:
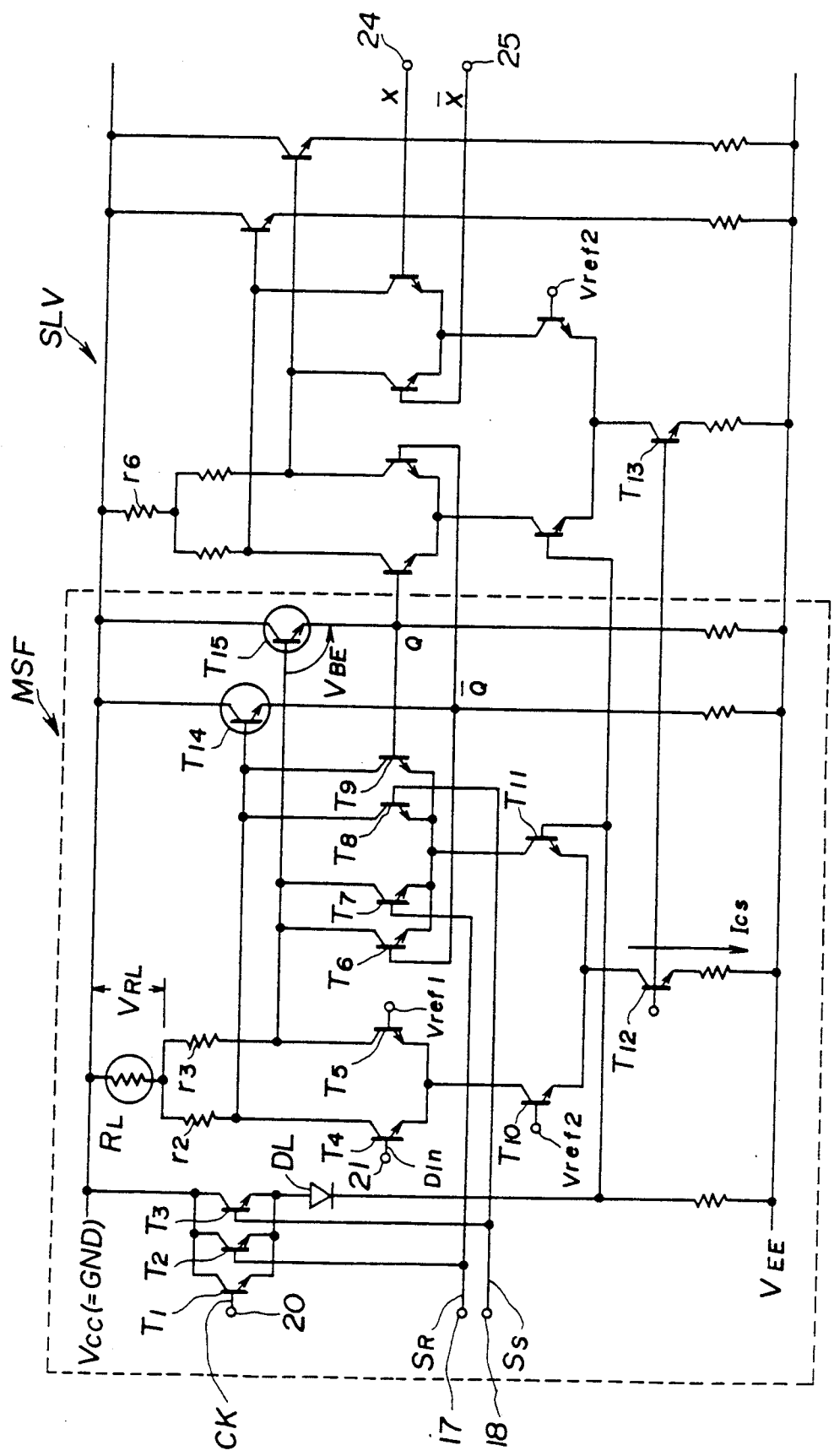
FIG. 9 is a circuit diagram showing a second embodiment of the master-slave flip-flop circuit according to the present invention.

Next, a description will be given of a second embodiment of the master-slave flip-flop circuit according to the present invention, by referring to FIG. 9. In FIG. 9, those parts which are substantially the same as those corresponding parts in FIG. 3 are designated by the same reference numerals, and a description thereof will be omitted. The circuit construction of this second embodiment is substantially the same as that of the first embodiment shown in FIG. 5 except that a circuit part is added to support the set and reset functions.

In FIG. 9, the adjusting resistors r4 and r5 shown in FIG. 3 are omitted, and the level shift resistor r1 shown in FIG. 3 is replaced by a level shift resistor $R_L$ which has a resistance such that the following relationship (2) is satisfied, where $V_H$ denotes a reset voltage of the reset signal $S_R$, $V_{RL}$ denotes a voltage drop of the level shift resistor $R_L$, and $V_{BE(T14 \text{ or } T15)}$ denotes a base-emitter voltage of the output transistor T14 or T15.

$$V_H > -(V_{RL} + V_{BE(T14\ or\ T15)}) \quad (2)$$

By setting the resistance of the level shift resistor $R_L$ to the value which satisfies the relationship (2), the voltage drop $V_{RL}$ at the level shift resistor $R_L$ becomes as described by the following formula (3), where $V_{r1}$, $V_{r4}$ and $V_{r5}$ respectively denote voltage drops at the resistors r1, r4 and r5 of the conventional master-slave flip-flop circuit.

$$V_{RL} = V_{r1} + V_{r4}\ (\text{or}\ V_{r5}) \quad (3)$$

That is, the voltage drop $V_{RL}$ at the level shift resistor $R_L$ is a sum of the voltage drop $V_{r1}$ of the level shift resistor r1 which is conventionally provided and not provided in this embodiment, and the voltage drop $V_{r4}$ of the adjusting resistor r4 or the voltage drop $V_{r5}$ of the adjusting resistor r5 which is conventionally provided and not provided in this embodiment. This means that the level shift resistor $R_L$ employed in this embodiment in effect functions as the level shift resistor r1 plus the adjusting resistor r4 or r5 which are conventionally provided but not provided in this embodiment.

Accordingly, it is possible to generate the required relative potential differences between the base potentials of the latch transistors T6 and T7 and the emitter potentials of the output transistors T14 and T15. As a result, it is possible to adjust the setting so that the reset voltage $V_H$ (and the set voltage) is positively set to a large value, without the need of the adjusting resistor r4 (or r5) which is conventionally required.

Since the output signals of the master circuit MSC is supplied to the slave circuit SLV with the differential drive, the resistance of the level shift resistor $R_L$ need not be fixed and may be changed arbitrarily. However, the level shift resistor r6 of the slave circuit SLV determines the interface level with respect to a circuit which is provided at a stage subsequent to the master-slave flip-flop circuit, and the resistance of the level shift resistor r6 must be fixed for this reason.

In this embodiment, it is of course possible to use the SCFL circuits in place of the ECL circuits, as described before with respect to the first embodiment.

Further, the present invention is not limited to these embodiments, but various variations and modifications may be made without departing from the scope of the present invention.

What is claimed is:

1. A master-slave flip-flop circuit comprising:
   master circuit means supplied with a data signal and a clock signal for holding the data signal responsive to the clock signal and for outputting the held data signal in a form of complementary output signals;
   slave circuit means supplied with the clock signal and the complementary output signals of said master circuit means for holding the complementary output signals of said master circuit means responsive to the clock signal and for outputting at least one of the held complementary output signals; and
   means for setting a logic amplitude of the complementary output signals of said master circuit means and a logic amplitude of the held complementary output signals of said slave circuit means so that the logic amplitude of the complementary output signals of said master circuit means is smaller than the logic amplitude of the held complementary output signals of said slave circuit means.

2. The master-slave flip-flop circuit as claimed in claim 1, wherein:
   said mater circuit means comprises first and second power sources, a first resistor having one terminal coupled to said first power source and another terminal coupled to a first node, a second resistor having one terminal coupled to said first power source and another terminal coupled to a second node, a pair of first output transistors coupled between said first and second power sources and responsive to a signal at a corresponding one of the first and second nodes for outputting the complementary output signals of said master circuit means, a first differential circuit responsive to the clock signal, a second differential circuit coupled between the first and second nodes and said first differential circuit and responsive to the data signal, a third differential circuit coupled between the first and second nodes and said first differential circuit and responsive to the complementary output signals of said first output transistors, and a first current source circuit coupled between said first differential circuit and said second power source.

3. The master-slave flip-flop circuit as claimed in claim 2, wherein:
   said slave circuit means comprises a third resistor having one terminal coupled to said first power source and another terminal coupled to a third node, a fourth resistor having one terminal coupled to said first power source and another terminal coupled to a fourth node, a pair of second output transistors coupled between said first and second power sources and responsive to a signal at a corresponding one of the third and fourth nodes for outputting the held complementary output signals of said slave circuit means, a fourth differential circuit responsive to the clock signal, a fifth differential circuit coupled between the third and fourth nodes and said fourth differential circuit and responsive to the complementary output signals of said master circuit means, a sixth differential circuit coupled between the third and fourth nodes and said fourth differential circuit and responsive to the held complementary output signals of said second output transistors, and a second current source circuit coupled between said fourth differential circuit and said second power source.

4. The master-slave flip-flop circuit as claimed in claim 3, wherein:
   said first and second resistors have resistances which are smaller than resistances of said third and fourth resistors.

5. The mater-slave flip-flop circuit as claimed in claim 4, wherein:
   said first and second resistors have identical resistances, and said third and fourth resistors have identical resistances.

6. The master-slave flip-flop circuit as claimed in claim 3, wherein:
   said master circuit means further comprises a first level shift resistor coupled between said first power source and said first and second resistors for causing a voltage drop of voltages applied to the first and second nodes from said first power source, and said slave circuit means further comprises a second level shift resistor coupled between said first power source and said third and fourth resistors for causing a voltage drop of voltages applied to the third and fourth nodes from said first power source.

7. A master-slave flip-flop circuit as claimed in claim 3, wherein:
said first, second and third differential circuits respectively are series gate type emitter coupled logic circuits.

8. The master-slave flip-flop circuit as claimed in claim 1, wherein:
the logic amplitude of said complementary output signals of said master circuit means is approximately one-half of the logic amplitude of the held complementary output signals of said slave circuit means.

9. The master-slave flip-flop circuit as claimed in claim 1, wherein:
the logic amplitude of said complementary output signals of said master circuit means is approximately 0.3 volts and the logic amplitude of the held complementary output signals of said slave part is approximately 0.6 volts.

10. A master-slave flip-flop circuit comprising:
first and second power sources;
master circuit means supplied with a data signal, a clock signal, a set signal and a reset signal, for outputting complementary output signals based on the data signal, the clock signal, the set signal and the reset signal, and including a first level shift resistor, series gate type differential circuits coupled between said first and second power sources through said first level shift resistor, and a pair of first output transistors coupled between said first and second power sources and responsive to signals received through said first level shift resistor so as to output the complementary output signals, said master circuit means having a signal latching state in which the data signal is latched;
a slave circuit means supplied with the clock signal and the complementary output signals of said master circuit means for providing at least one output signal based upon at least one of the complementary output signals of said master circuit means and the clock signal;
a set and reset circuit means for setting said master circuit means to the signal latching state responsive to the set signal and for resetting said master circuit means from the signal latching state responsive to the reset signal; and
said first level shift resistor having a resistance which satisfies a relationship $V_H > -(V_{RL} + V_{BE})$, where $V_H$ denotes a voltage of the set and reset signals during a high-level period thereof, $V_{RL}$ denotes a voltage drop caused by said first level shift resistor, and $V_{BE}$ denotes a base-emitter voltage of said first output transistors.

11. The master-slave flip-flop circuit as claimed in claim 10, wherein:
said master circuit means comprises a first resistor having one terminal coupled to said first power source through said first level shift resistor and another terminal coupled to a first node, a second resistor having one terminal coupled to said first power source through said first level shift resistor and another terminal coupled to a second node, said first output transistors being responsive to a signal at a corresponding one of the first and second nodes for outputting the complementary output signals of said master circuit means, a first differential circuit responsive to the clock signal, a second differential circuit coupled between the first and second nodes and said first differential circuit and responsive to the data signal, a third differential circuit coupled between the first and second nodes and said first differential circuit and responsive to the complementary output signals of said first output transistors, and a first current source circuit coupled between said first differential circuit and said second power source, said set and reset circuit means being coupled to said first and second nodes.

12. The master-slave flip-flop circuit as claimed in claim 11, wherein:
said slave circuit means comprises a second level shift resistor, a third resistor having one terminal coupled to said first power source through said second level shift resistor and another terminal coupled to a third node, a fourth resistor having one terminal coupled to said first power source through said second level shift resistor and another terminal coupled to a fourth node, a pair of second output transistors coupled between said first and second power sources and responsive to a signal at a corresponding one of the third and fourth nodes for outputting the output signal of said slave circuit means, a fourth differential circuit responsive to the clock signal, a fifth differential circuit coupled between the third and fourth nodes and said fourth differential circuit and responsive to the complementary output signals of said master circuit means, a sixth differential circuit coupled between the third and fourth nodes and said fourth differential circuit and responsive to the output signal of said second output transistors, and a second current source circuit coupled between said fourth differential circuit and said second power source.

13. The master-slave flip-flop circuit as claimed in claim 12, wherein:
said first and second resistors have resistances which are smaller than resistances of said third and fourth resistors.

14. The master-slave flip-flop circuits as claimed in claim 13, wherein:
said first and second resistors have identical resistances, and said third and fourth resistors have identical resistances.

15. The master-slave flip-flop circuit as claimed in claim 12, wherein:
said first, second and third differential circuits respectively are series gate type emitter coupled logic circuits.

16. The master-slave flip-flop circuit as claimed in claim 12, wherein:
said second level shift resistor has a resistance that is fixed.

17. The master-slave flip-flop circuit as claimed in claim 16, wherein:
said first level shift resistor has a resistance that is arbitrarily selected within a range that satisfies said relationship.

18. The master-slave flip-flop circuit as claimed in claim 10, wherein:
said first level shift resistor has a resistance that is arbitrarily selected within a range that satisfies said relationship.

* * * * *

UNITED STATES PATENT AND TRADEMARK OFFICE
CERTIFICATE OF CORRECTION

PATENT NO. : 5,001,361
DATED : March 19, 1991
INVENTOR(S) : Masaya Tamamura et al.

It is certified that error appears in the above-identified patent and that said Letters Patent is hereby corrected as shown below:

PTO  Column 6, line 25, change "216" to --Q16--;

Column 9, line 32, change "MSC" to --MSF--; and

Column 10, line 54, change "mater" to --master--.

Signed and Sealed this

Sixth Day of October, 1992

Attest:

DOUGLAS B. COMER

Attesting Officer  Acting Commissioner of Patents and Trademarks